(12) United States Patent
Tandy

(10) Patent No.: US 6,404,216 B1
(45) Date of Patent: *Jun. 11, 2002

(54) TEST CONTACT

(75) Inventor: Patrick W. Tandy, Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 10 days.

(21) Appl. No.: 09/259,423

(22) Filed: Feb. 26, 1999

(51) Int. Cl.[7] .................................................. G01R 31/02
(52) U.S. Cl. ..................................................... 324/755
(58) Field of Search ............................... 324/537, 158.1, 324/546, 653, 655, 718, 755; 257/666, 668, 672, 667, 676, 678, 691, 778; 430/22, 312, 318

(56) References Cited

U.S. PATENT DOCUMENTS

| | | | |
|---|---|---|---|
| 5,451,489 A | * 9/1995 | Leedy | 430/313 |
| 5,618,404 A | 4/1997 | Okuhama et al. | 205/445 |
| 5,623,163 A | * 4/1997 | Izumi | 257/667 |
| 5,661,337 A | 8/1997 | Manteghi | 257/676 |
| 5,696,033 A | * 12/1997 | Kinsman | 437/217 |
| 5,789,280 A | 8/1998 | Yokota | 438/123 |
| 5,789,803 A | 8/1998 | Kinsman | 257/666 |
| 6,034,422 A | * 3/2000 | Horita et al. | 257/677 |
| 6,118,286 A | * 9/2000 | Fredrickson | 324/754 |

* cited by examiner

Primary Examiner—N. Le
Assistant Examiner—E P LeRoux
(74) Attorney, Agent, or Firm—Dickstein Shapiro Morin & Oshinsky LLP

(57) ABSTRACT

A semiconductor leadframe with an improved test contact is disclosed. Leadframes that are coated with a harder thinner material such as Nickel/Palladium and subsequently plated with a softer and thicker metal test contact, such as gold or silver, is disclosed. The areas that are plated with the test contact are on lead fingers where a test probe would normally contact. The test probe penetrates the softer material much easier allowing for a good contact, thus better testing and burning-in.

20 Claims, 17 Drawing Sheets

TEST CONTACT

The present invention relates to semiconductor chip packages and leadframes, and more particularly to a technique for improving the test contact on leadframe fingers.

BACKGROUND OF THE INVENTION

Advances in semiconductor device technology have significantly increased the number of transistors that can be fabricated on a single semiconductor substrate. This increase in the number of transistors has had a corresponding decrease in transistor dimensions. Although semiconductor devices have decreased significantly in size, they still need to be interfaced with other devices. Semiconductor packaging schemes allow such interface. Examples of semiconductor packaging are Lead-On-Chip (LOC), and Dual-In-Line (DIP). In each of the packaging schemes, the resulting semiconductor device will reside in a package from which electrical leads will protrude. In turn the electrical leads will be affixed to a control board, such as a printed circuit board.

Prior to final affixation to a control board, it is desirable that the semiconductor devices be tested and burned-in. Post-fabrication testing and burning-in of packaged semiconductor devices is necessary to ensure proper performance of the devices. The use of leadframes allows a multitude of chips to be tested and burned-in. Leadframes are manufactured either by stamping the pattern for the leadframe from the leadframe material or by etching process. Traditionally leadframes are made of an iron system or copper system alloy that allows for durability and electrical conductivity. The base material is then coated with a Tin/Lead (Sn/Pb) plating. The Sn/Pb plating serves two purposes. First, the layer allows for easy soldering to a control board, since Sn/Pb is a typical soldering material. Second, the Sn/Pb plating is a soft material that allows for easy penetration of a test probe made of a harder material. Most test probes are made of a beryllium-copper base material, plated with a nickel, then gold coating. The penetration of the test probe into the soft plating creates a larger surface area for good electrical contact. The soft outer plating allows for a good ohmic and non-rectifying contact with the test probe, allowing accurate testing and efficient burn-in. A good contact will obey Ohm's law:

$$V=IR$$

where V is the voltage, I is the current and R is the resistance across the contact. Such a contact is in contrast to one where rectification between the contacting materials forms a region of high impedance such as a Schottky Barrier.

In recent years, particularly with the trend to move away from materials that contain lead, many leadframe manufacturers have used a nickel/palladium (Ni/Pd) plating on top of the base material. The Ni/Pd plating is a much harder material. While the Ni/Pd does not interfere with the soldering to a control board, it does not allow penetration of test probes into the material. The result is a bad electrical contact between the test probe and the leadframe legs, interfering with both proper electrical characterization and burn-in. In addition, the harder Ni/Pd layer wears the test probe surface, stripping the outer gold layer and decreasing the useful life of the probe.

SUMMARY OF THE INVENTION

In general, the invention provides an improved test contact surface for semiconductor tests and burn-in. In one aspect, a semiconductor leadframe is disclosed. The semiconductor leadframe includes a plurality of semiconductor chip mounting structures, which are arranged along a longitudinal axis, forming a long body; first and second guide rails, which are substantially parallel, formed at each side of the long body; and lateral support rails substantially perpendicular to the first and second guide rails and arranged between each of said chip mounting structures. Each of said mounting structures includes, fingers, having a top and bottom surface, for forming leads, the fingers connected to at least one of said first and second guide rails, and lateral support rails, a semiconductor chip mounting pad for mounting a semiconductor chip thereon, chip mounting pad supports for supporting the mounting pad, the chip mounting pad supports extending from the long body to the chip mounting pad, thereby supporting the chip mounting pad, test contacts on at least one of the top, and bottom surfaces of the fingers.

In another aspect, another embodiment of a semiconductor leadframe is disclosed. The semiconductor leadframe includes a plurality of semiconductor chip mounting structures, which are arranged along a longitudinal axis, forming a long body; first and second guide rails, which are substantially parallel and formed at each side of the long body; and lateral support rails substantially perpendicular to the first and second guide rails and arranged between each of the chip mounting structures. Each of the mounting structures includes, fingers, having a top and bottom surface, for forming leads, which are connected to at least one of said first and second guiderails; and the lateral support rails, where the fingers are adapted for receiving a semiconductor chip; and test contacts on at least one of the top and bottom surfaces of the fingers.

A semiconductor chip is attached to the die pad of the leadframe. Most of the leadframe and the chip is encapsulated in a semiconductor package. A molded carrier ring is formed around the leadframe for testing and handling. A test probe is put in contact with the test contacts for testing and burning-in the semiconductor chip.

In one implementation, the test contacts are made of a soft metal such as gold or silver.

In another aspect of the invention a method of manufacturing a semiconductor device assembly is disclosed. The method includes the steps of forming a semiconductor leadframe with a plurality of lead fingers; coating the leadframe with a hard, conductive material; and forming test contacts on said lead fingers.

In other implementations of the method, there are additional steps of mounting a semiconductor chip on the leadframe; encapsulating the leadframe, the semiconductor chip, and a portion of said plurality of lead fingers in a semiconductor package; and placing a test probe on the test contacts.

DETAILED DESCRIPTION

Figure 1A:
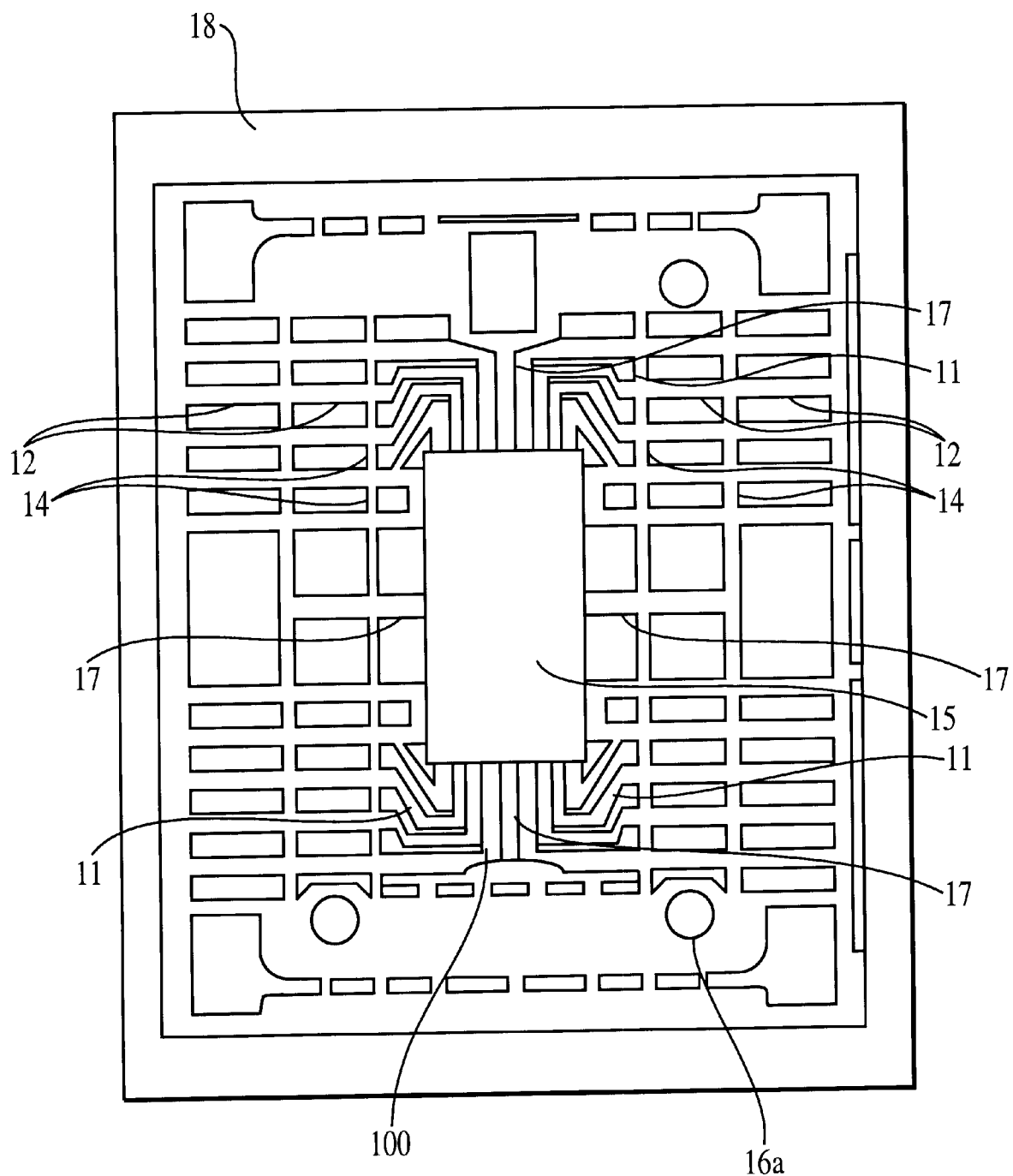
FIG. 1A illustrates a leadframe.
Figure 1B:
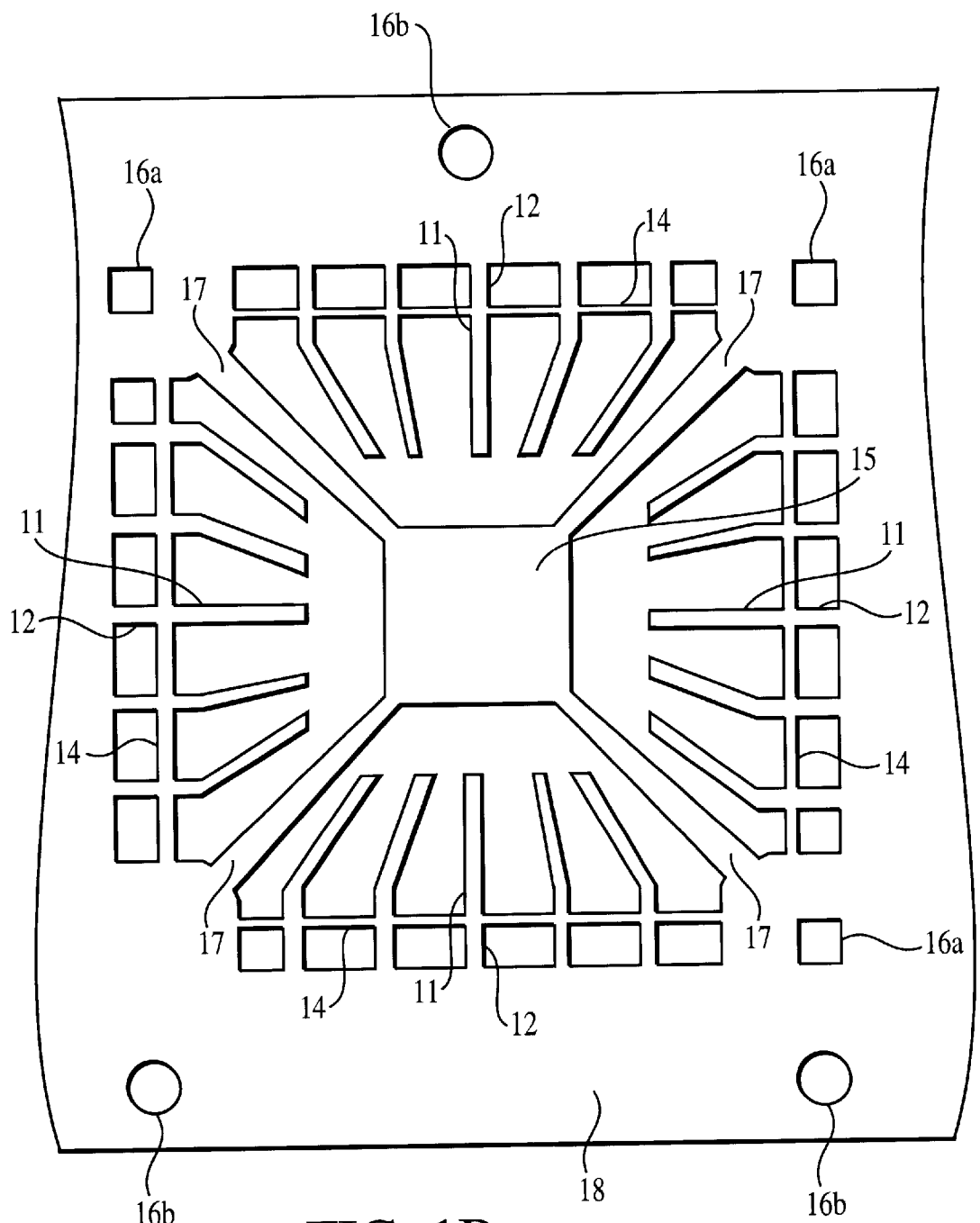
FIG. 1B illustrates a leadframe.

Referring to FIGS. 1A and 1B leadframe 18 is centered by a die pad, or chip mounting pad supports, 15 for mounting a semiconductor chip or die thereon, supported by die pad supports, or chip mounting pad supports, 17. Four sets of fingers create inner leads 11 and outer leads 12. Four sets of tiebars or dam-bars 14 prevent leakage of molding material or compound during a molding process step. Tiebars 14 run parallel and opposite each side of die pad 15. Inner leads 11 protrude from the tiebars 14 toward a corresponding side of the die pad 15. The inner leads 11 surround the die pad 15 but do not come into contact with die pad 15. Outer leads 14 protrude substantially opposite inner leads 11 and attach to the body of leadframe 18. Die pad supports 17 extend from a corresponding corner of die pad 15 to the body of leadframe 18. The die pad 15, die pad supports 17, lead fingers and test contacts (described below) form a semiconductor chip mounting structure 100.

Three first indexing holes. 16a and three second indexing holes 16b are used to facilitate transport and handling of the leadframe throughout the packaging process.

The invent,ion is not limited to the leadframes illustrated in FIGS. 1A and 1B. The figures are used simply to illustrate an embodiment of the invention. The invention can easily be implemented on a multitude of other leadframe designs.

Figure 2:
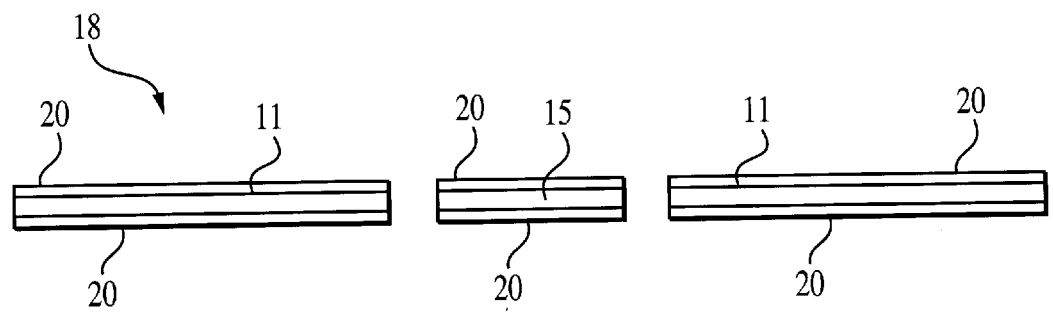
FIG. 2 illustrates a sideview of a leadframe with a hard metallic coating.
Figure 3:
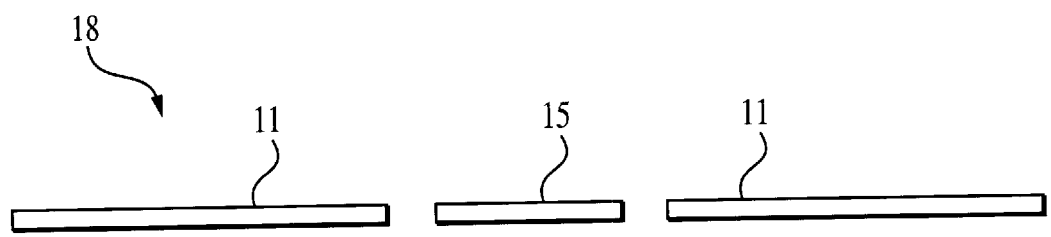
FIG. 3 illustrates a sideview of a leadframe without a hard metallic coating.

In an embodiment of the invention the entire leadframe is coated with a hard, thin layer of material, such as Ni/Pd, for ultimate bonding with a printed circuit board (PCB). The leadframe itself is formed either by stamping or etching from iron or copper system alloys. FIG. 2 illustrates a sideview of leadframe 18. All portions of leadframe 18 are covered with a Ni/Pd coating 20. In another embodiment of the invention leadframe 18 is left uncoated until a later processing step. FIG. 3 illustrates a sideview of leadframe 18 without a Ni/Pd coating.

Figure 4:
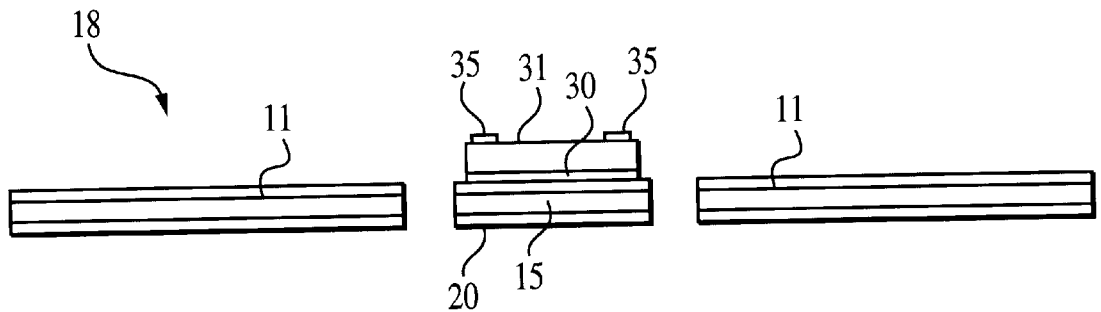
FIG. 4 illustrates a sideview of a semiconductor chip mounted on a leadframe.
Figure 5:
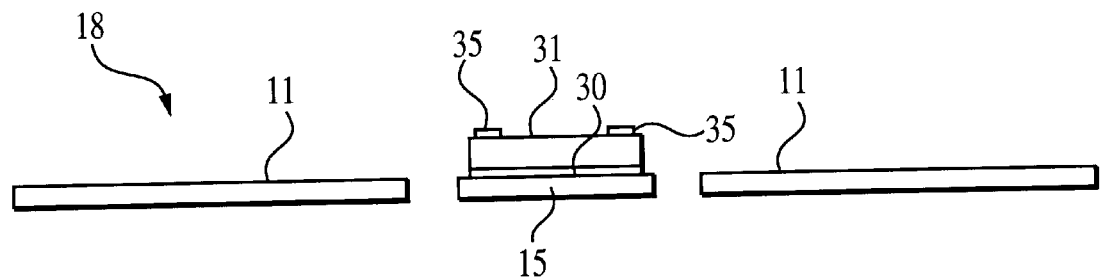
FIG. 5 illustrates a sideview of a semiconductor chip mounted on a leadframe.

Referring now to FIGS 4, 5, embodiments of the invention with and without the Ni/Pd layer 20 are shown. At this time a semiconductor chip or device 31 is mounted on die pad 15. Mounting material 30 is placed between die pad 15 and semiconductor chip 31 in order to provide adhesion between die pad 15 and semiconductor chip 31. The mounting material 30 may be but is not limited to alumina-, silver- or gold-filled epoxies, which provide good thermal conductivity and low resistance contacts. Other mounting materials include acrylics polyimides and silicones.

Figure 6:
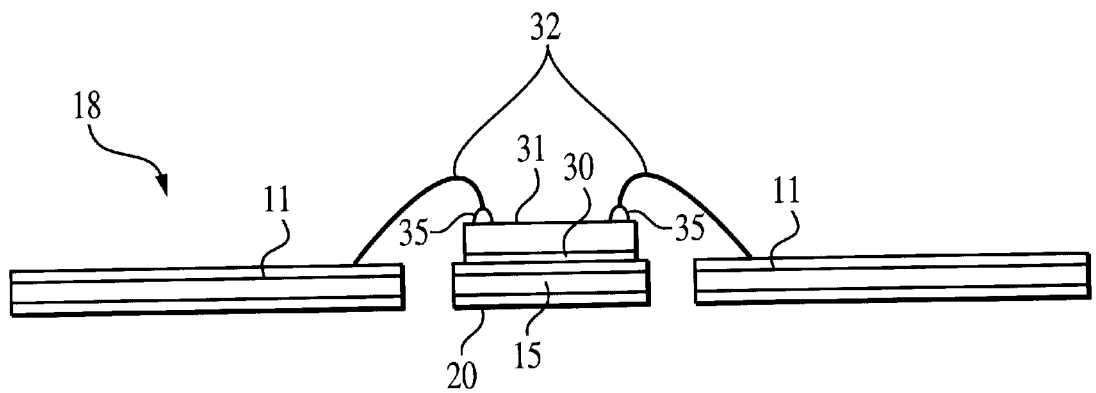
FIG. 6 illustrates a sideview of bond wires electrically connecting a semiconductor chip and a leadframe.
Figure 7:
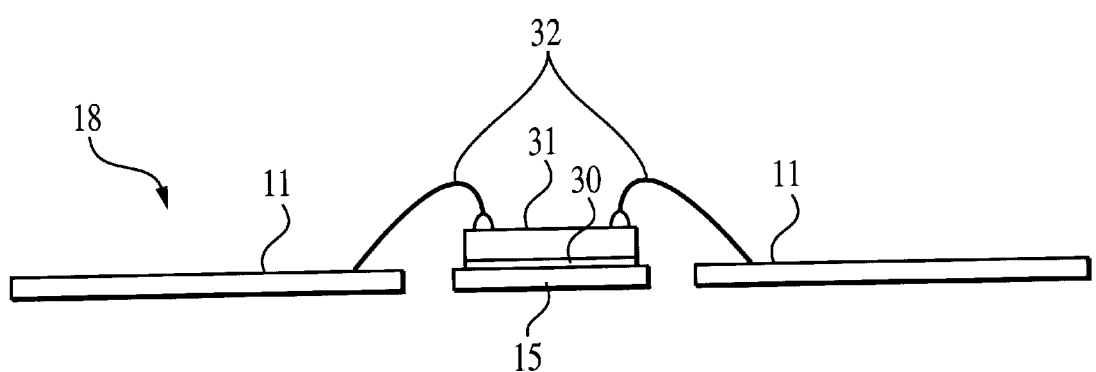
FIG. 7 illustrates a sideview of bond wires electrically connecting a semiconductor chip and a leadframe.

Referring now to FIGS. 6, 7, bonding wire 32 is attached between inner leads 11 of leadframe 18 and bonding pads 35 on semiconductor chip 31. Bonding wire 32 may be, but is not limited to, aluminum or gold compounds, which provide good electrical conductivity. Methods to attach bonding wire 32 between inner leads 11 and bonding pads (not shown) may be by thermocompression bonding, ultrasonic bonding or thermosonic bonding.

Figure 8:
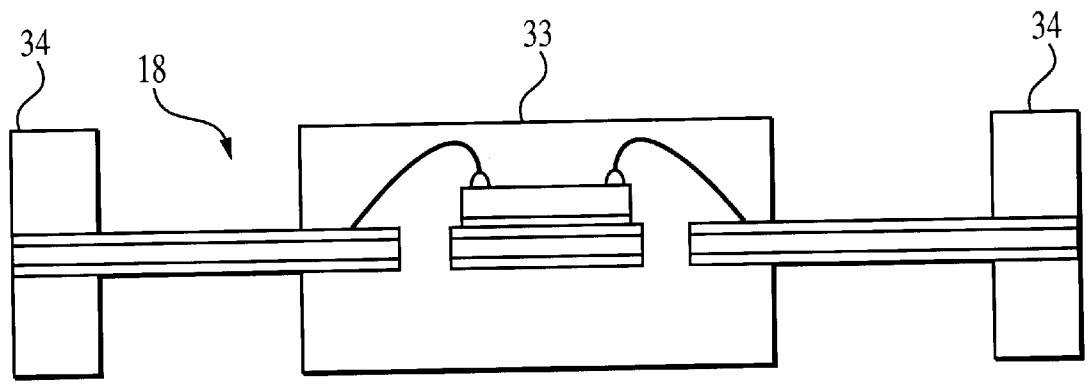
FIG. 8 illustrates a sideview of a leadframe encapsulated in plastic and surrounded by a molded carrier ring.
Figure 9:
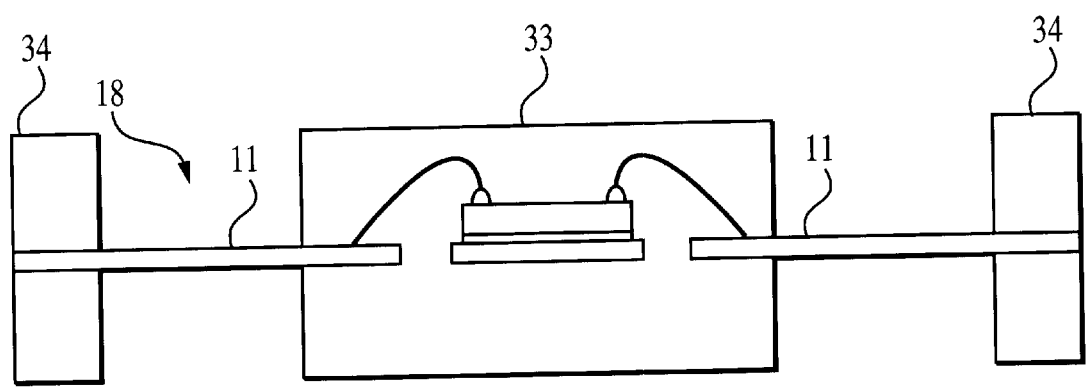
FIG. 9 illustrates a sideview of a leadframe encapsulated in plastic and surrounded by a molded carrier ring.

Referring now to FIGS. 8, 9, die pad 15, semiconductor chip 31, bonding wires 32 and a portion of inner leads 11 are molded into a plastic semiconductor package 33. Many different packaging schemes can be used for purposes of the invention, using the leadframe. FIGS. 8, 9 show conventional plastic or ceramic packaging.

Referring still to FIGS. 8, 9, a molded carrier ring 34 is formed on leadframe 18. Molded carrier ring 34 is formed in order to facilitate handling and testing of the leadframe 8. Any method could be used to form carrier ring 34. One such method is molding a silica filled epoxy novolac around the outer portion of leadframe 18.

Figure 10:
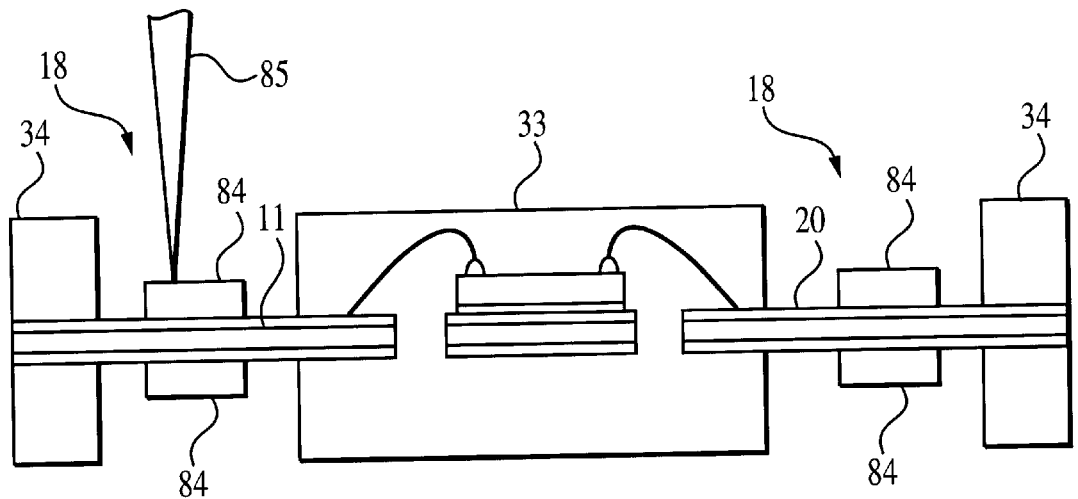
FIG. 10 illustrates a sideview of an encapsulated leadframe with test contacts formed on the lead fingers.
Figure 11:
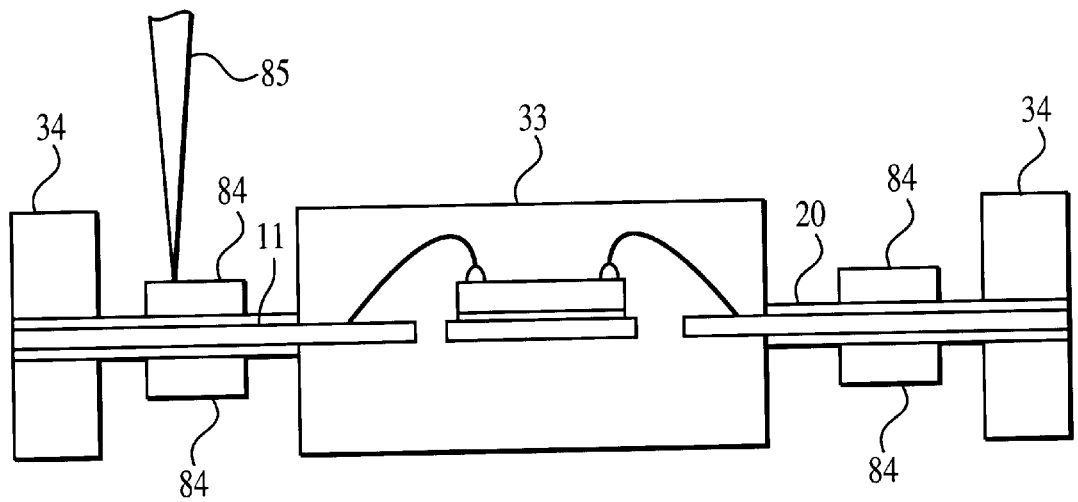
FIG. 11 illustrates a sideview of an encapsulated leadframe with test contacts formed on the lead fingers.

Referring now to FIG. 10, leadframe 18 encapsulated in plastic package 33 is deposited with test contact 84. FIG. 11 illustrates an embodiment of the invention where leadframe 18 which was not yet deposited with a Ni/Pd layer is first deposited with the Ni/Pd layer 20 on the protruding portion of lead fingers 11. Test contact 84 is deposited on the portion of lead fingers 11 which protrudes from plastic package 33. Test contacts 84 are preferably placed on lead fingers 11, between plastic package 33 and molded carrier ring 34. Test contacts 84 are generally made to be thicker than the Ni/Pd layer 20. Test contact 84 are formed from a soft metallic material such as, for example, silver or gold. Although many thicknesses would suffice, a good thickness for test contacts 84 is approximately 200 microinches. Although the placement of test contacts 84 is not limited to any particular coordinate on lead fingers 11, the placement must be at a coordinate where a test probe 85 will contact lead fingers 11 in absence of test contact 84. Test contacts 84 may be deposited earlier in the manufacturing process after the step of coating leadframe 18 with Ni/Pd layer 20.

Figure 12:
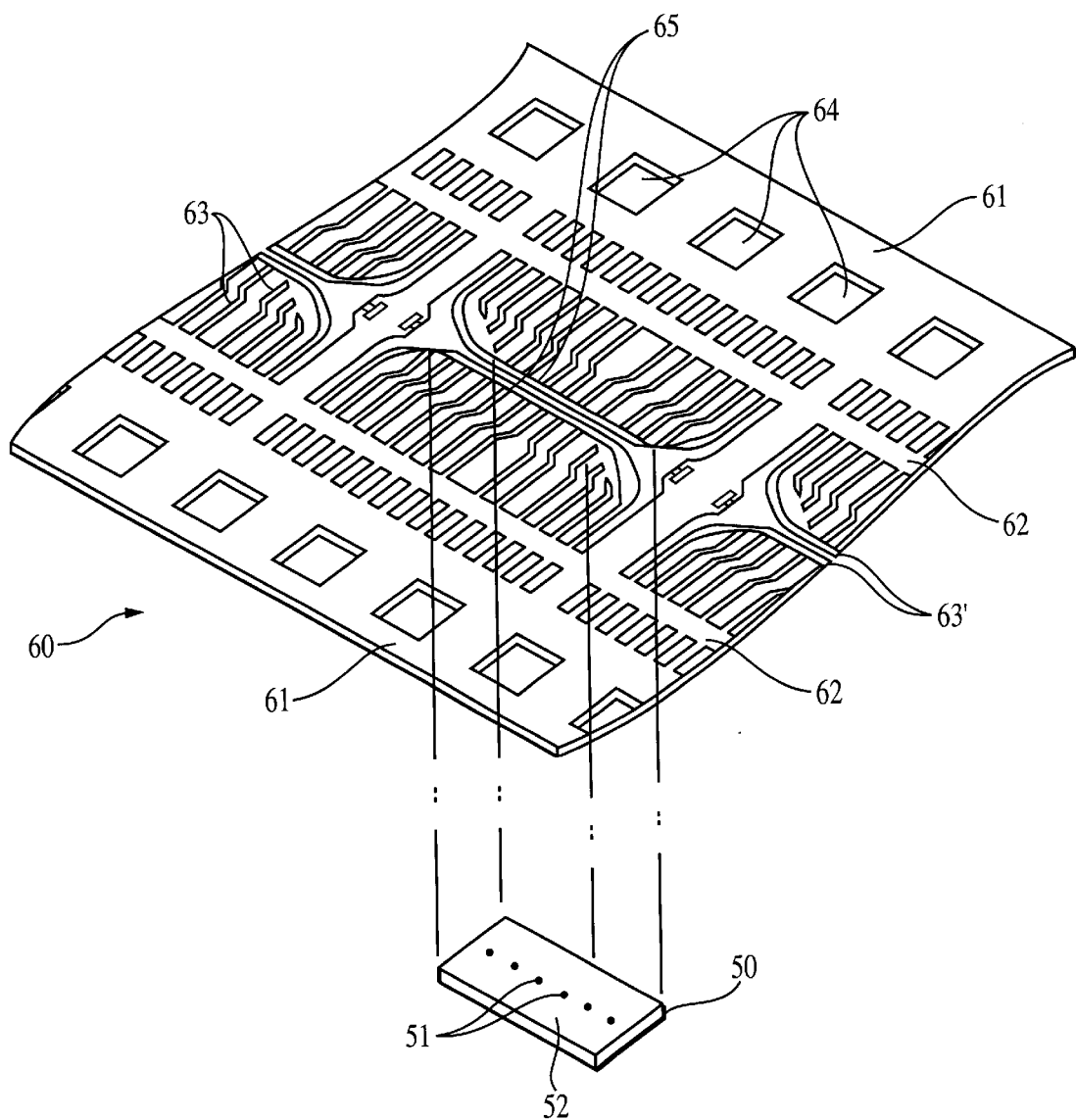
FIG. 12 illustrates a Lead-On-Chip (LOC) leadframe and semiconductor chip.

Referring now to FIG. 12, another embodiment of the invention, Lead-On-Chip (LOC) leadframes may be used to package and test the semiconductor chip. An LOC die 50 is generally rectangular in shape including a die face 52 where the circuitry is formed. A plurality of bond pads 51 are formed across the center of the die and are electrically coupled with the circuitry on the die 50.

Leadframe 60 is formed either by stamping or etching from the iron or copper system alloys. Side rails 61 contain indexing holes 64 which facilitate handling and transport of the leadframe 60. Sidebars 62 increase rigidity of leadframe 60 and also prevent leakage of molding material onto the die 50 during the molding process. Lead fingers 63 begin running substantially perpendicular to both side rails 61 and side bars 62 and protrude toward the center of leadframe 60. Lead fingers 63 angle to attach substantially perpendicular with bus bars 63'. Leadfingers will ultimately by trimmed to connect,electrically with bonding pads 51 on die 50. Bus bars 63' provide the ability to make multiple connections with lead fingers 62. Bus bars 63' will ultimately be trimmed according to the specifications of die 50.

Figure 13:
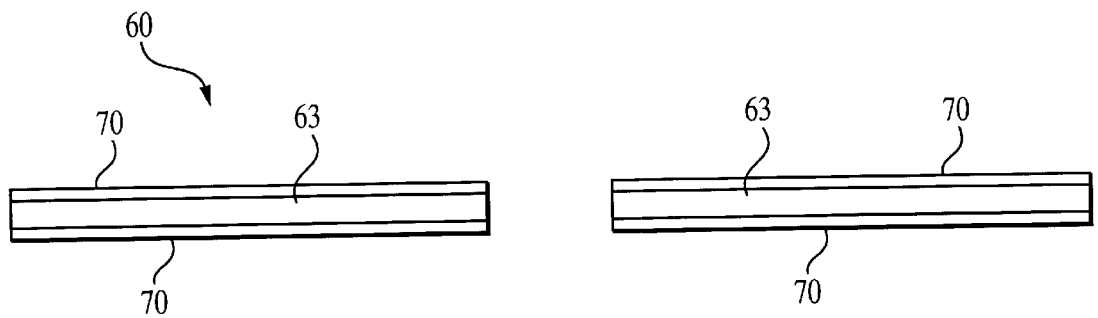
FIG. 13 illustrates a sideview of an LOC leadframe with a hard metallic coating.
Figure 14:
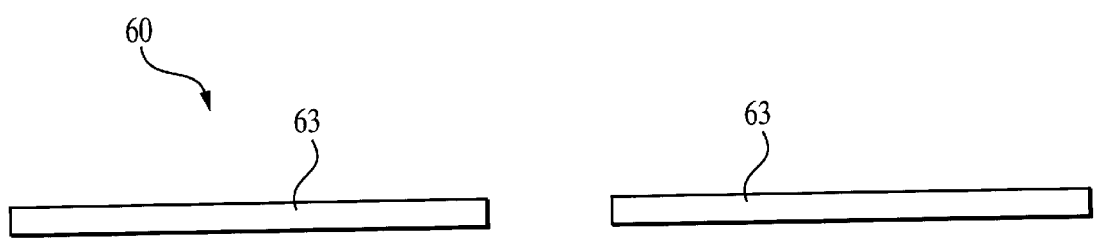
FIG. 14 illustrates a sideview of an LOC leadframe without a hard metallic coating.

In an embodiment of the invention the entire leadframe is coated with a hard, thin layer of material, such as Ni/Pd, for ultimate bonding with a printed circuit board (PCB). FIGS. 13, 14 illustrate a sideview of LOC leadframe 60. All portions of leadframe 60 are covered with a Ni/Pd coating 70 in FIG. 13. In another embodiment of the invention leadframe 60 is left uncoated until a later processing step. FIG. 14 illustrates a sideview of LOC leadframe 60 without a hard metallic coating.

Figure 15:
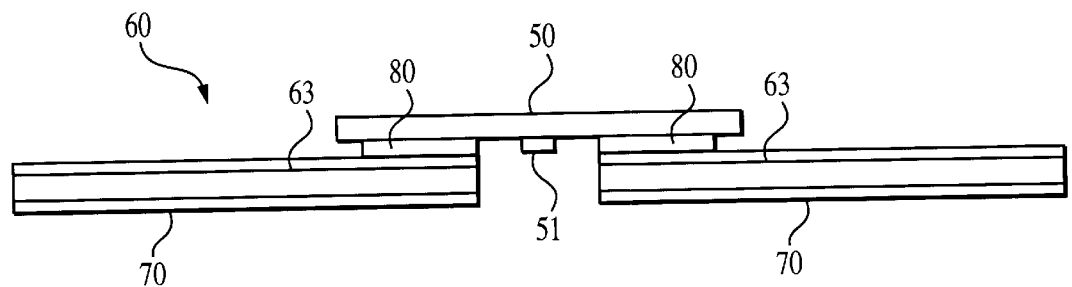
FIG. 15 illustrates a sideview of an LOC leadframe mounted with a semiconductor chip.
Figure 16:
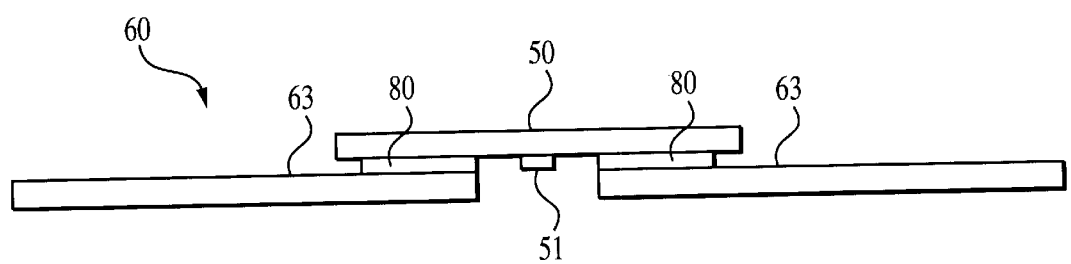
FIG. 16 illustrates a sideview of an LOC leadframe mounted with a semiconductor chip.

FIGS. 15, 16 illustrate an embodiment of the invention with and an embodiment without the Ni/Pd layer 20. A die 50 is attached to leadframe 60 using an adhesive 80. The die 50 is firmly attached to lead fingers 63. Adhesive LOC tape is commonly used. Other mounting materials may be used. For example the mounting material may be but is not limited to alumina-, silver- or gold-filled epoxies, which provide good thermal conductivity and low resistance contacts. Other mounting materials include acrylics, polyimides and silicones. The adhesive is patterned so that bonding pads 51 are left exposed for later attachment to bonding wires.

Figure 17:
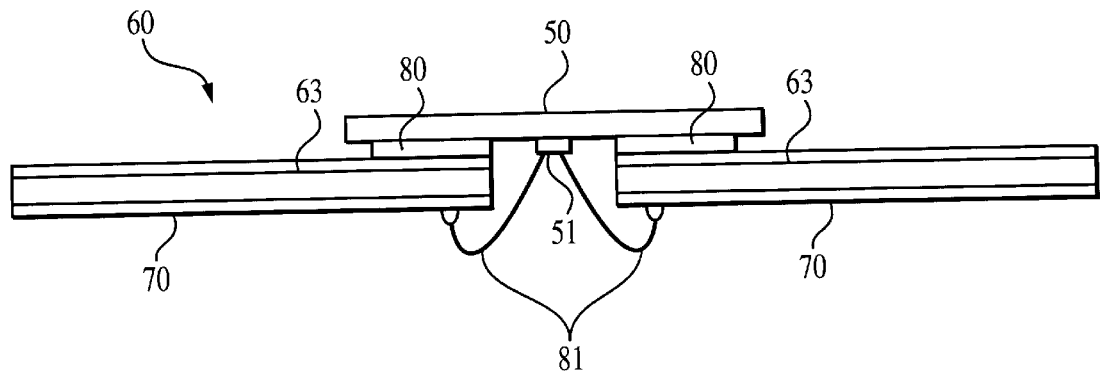
FIG. 17 illustrates a sideview of bond wires electrically connecting an LOC leadframe and a semiconductor chip.
Figure 18:
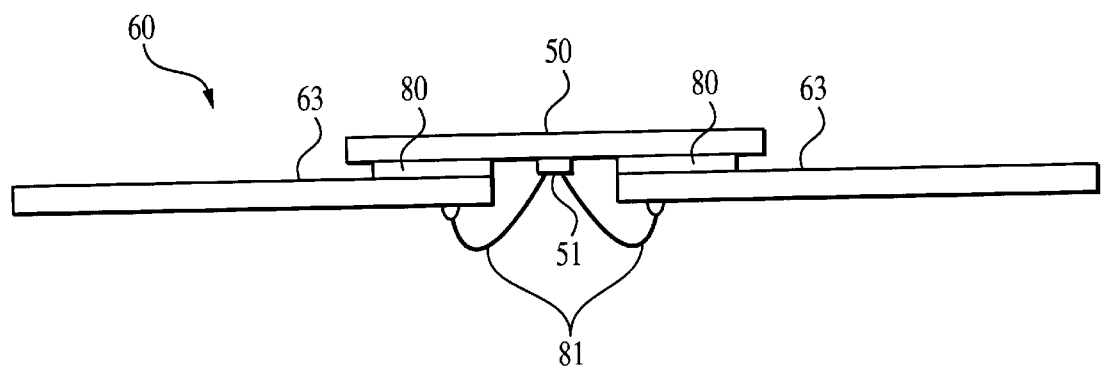
FIG. 18 illustrates a sideview of bond wires electrically connecting an LOC leadframe and a semiconductor chip.

Referring now to FIGS. 17, 18 bonding wire 81 is attached between lead fingers 63 of leadframe 60 and bonding pads 51 on semiconductor chip 50. Bonding wire 81 may be, but is not limited to, aluminum or gold compounds, which provide good electrical conductivity. Methods to attach bonding wire 81 between lead fingers 63 and bonding pads 16 may be by thermocompression bonding, ultrasonic bonding or thermosonic bonding.

Figure 19:
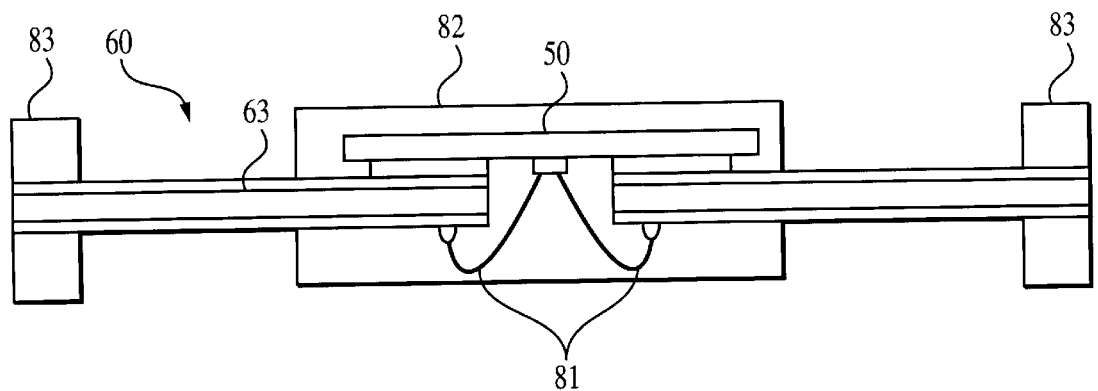
FIG. 19 illustrates a sideview of an LOC leadframe encapsulated in a plastic package and surrounded by a molded carrier ring.
Figure 20:
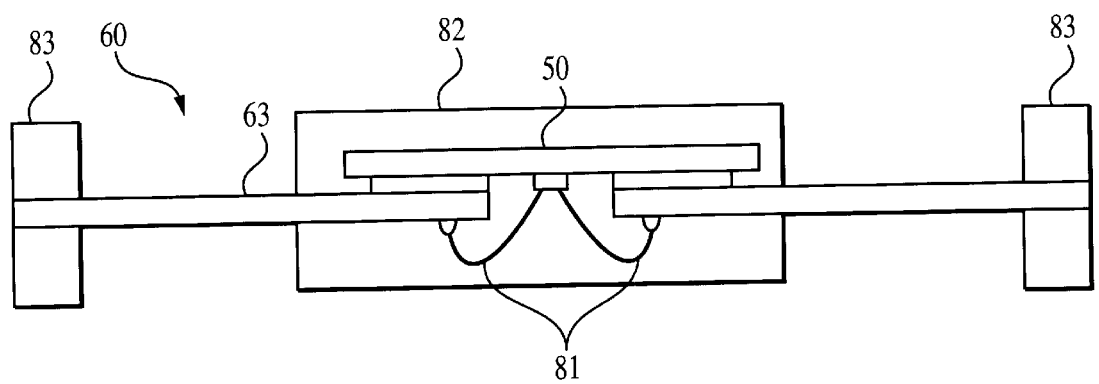
FIG. 20 illustrates a sideview of an LOC leadframe encapsulated in a plastic package and surrounded by a molded carrier ring.

Referring now to FIGS. 19, 20, die 50, most of LOC leadframe 60, and bonding wires 81 are molded into a plastic package 82. Many different packaging schemes can be used for purposes of the invention, using the LOC leadframe. FIGS. 19, 20 show conventional plastic packaging.

Referring still to FIGS. 19, 20 a molded carrier ring 83 is formed on LOC 60. Molded carrier ring 83 is formed in order to facilitate handling and testing of the LOC 60. Any method could be used to form carrier ring 83. One such method is molding a silica filled epoxy novolac around the outer portion of LOC 60.

Figure 21:
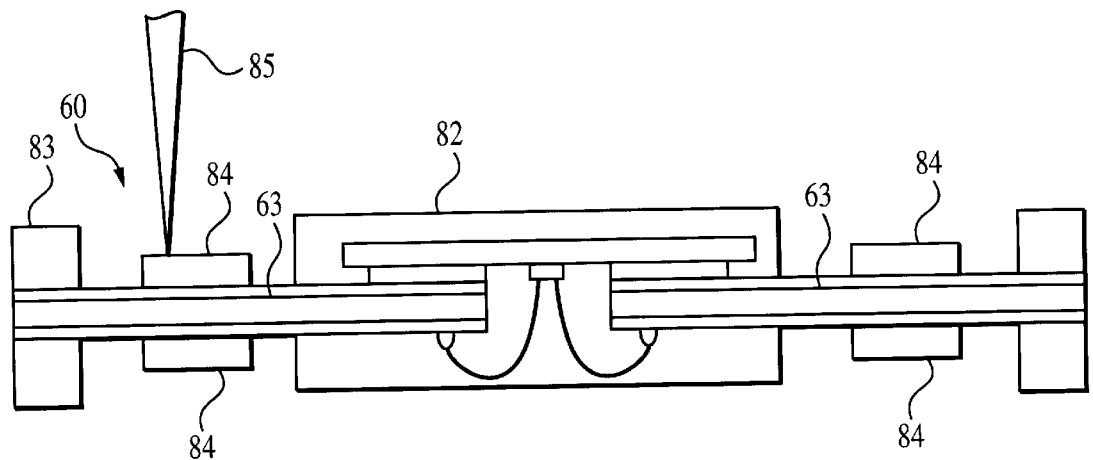
FIG. 21 illustrates a sideview of an encapsulated LOC leadframe with test contacts formed on the lead fingers.
Figure 22:
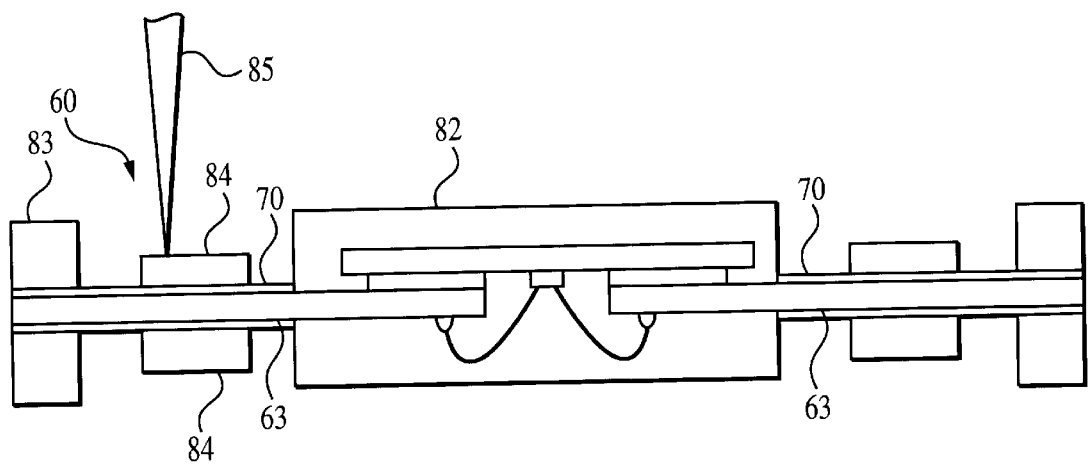
FIG. 22 illustrates a sideview of an encapsulated LOC leadframe with test contacts formed on the lead fingers.

Referring now to FIG. 21 leadframe 60 encapsulated in plastic package 82 is deposited with test contact 84. FIG. 22 illustrates an embodiment of the invention where leadframe 60 which was not yet deposited with a Ni/Pd layer is first deposited with the Ni/Pd layer 70 on the protruding portion of lead fingers 63. Test contact 84 is deposited on the portion of lead fingers 63 which protrudes from plastic package 82. Test contacts 84 are preferably placed on lead fingers 63, between plastic package 82 and molded carrier ring 83. Test contacts 84 are generally made to be thicker than the Ni/Pd layer 20. Although many thicknesses would suffice, a good thickness for test contacts 84 is approximately 200 microinches. Although the placement of test contacts 84 is not limited to any particular coordinate on lead fingers 63, the placement must be at a coordinate where a test probe 85 will contact lead fingers 63 in absence of test contact 84. Test contacts 84 may be deposited earlier in the manufacturing process after the step of coating leadframe 60 with Ni/Pd layer 70.

Figure 23:
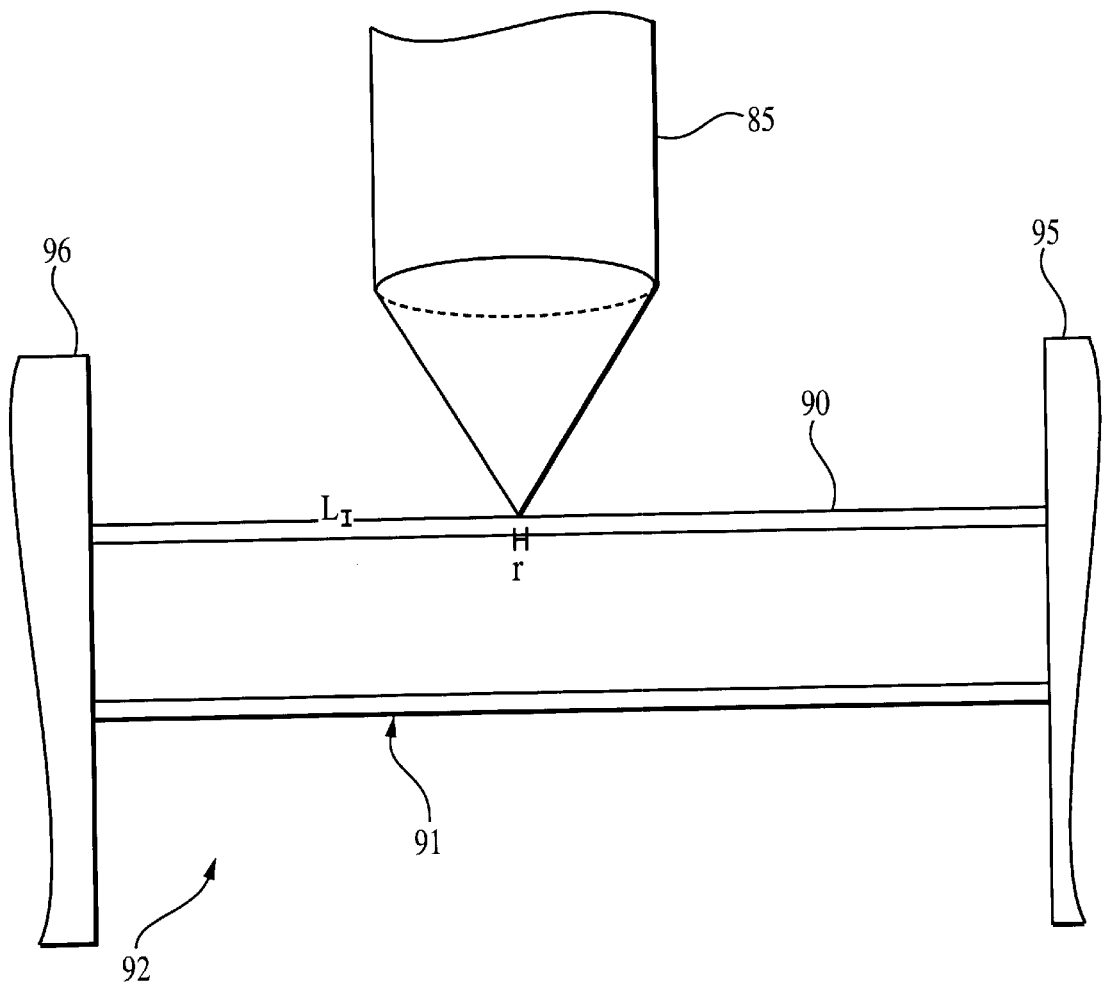
FIG. 23 illustrates a test probe in contact with a hard metallic surface in the prior art.

Referring now to FIG. 23 a closeup of test probe 85 in contact with a hard metallic surface 90, such as Ni/Pd, is illustrated without the soft metallic layer as disclosed. Leadframe 92 as illustrated is any one of the conventional leadframes. Packaging 96 is. also illustrated and can be any semiconductor packaging scheme. Lead fingers 91 are the respective lead fingers. Molded carrier ring 95 is still present for support and handling during testing. FIG. 23 illustrates the poor contact that test probe 85 makes with Ni/Pd surface 90. It is well-known in physics that a larger surface area contact will decrease the resistance of the contact thereby creating a good ohmic contact. For such a contact the resistance can be estimated by the following equation:

$$R = \frac{\rho}{A}$$

where R is the contact resistance between the probe and contact region, $\rho$ is the estimated resistivity of test probe 85 and the test region of surface 90 in question, and A is the area of contact between test probe 85 and surface 90. If test probe 85 is approximated to be a conical shape then the contact between test probe 85 and surface 90 will be a conical surface and thus:

$$A = \pi(\sqrt{r^2+L^2})r$$

where r is the radius of the circle formed by the penetration contact between test probe 85 and surface 90, and L is the depth of penetration. FIG. 23 illustrates that the penetration circle will be very small since the tip of test probe 85 is in contact with the Ni/Pd surface 90. With a very small r and L, R will increase rapidly because it is inversely proportional to $r^2$ and $L^2$. The greater r and L, the lower the resistance R. In the worst situation, surface impurities or discontinuities would create such a small area or no ohmic contact at all that the resistance would be infinite. Although the test probe has been approximated to be a conical surface, the invention is not limited to test probes with conical surfaces. Any test probe with any surface is suitable to use with test contact 84.

Figure 24:
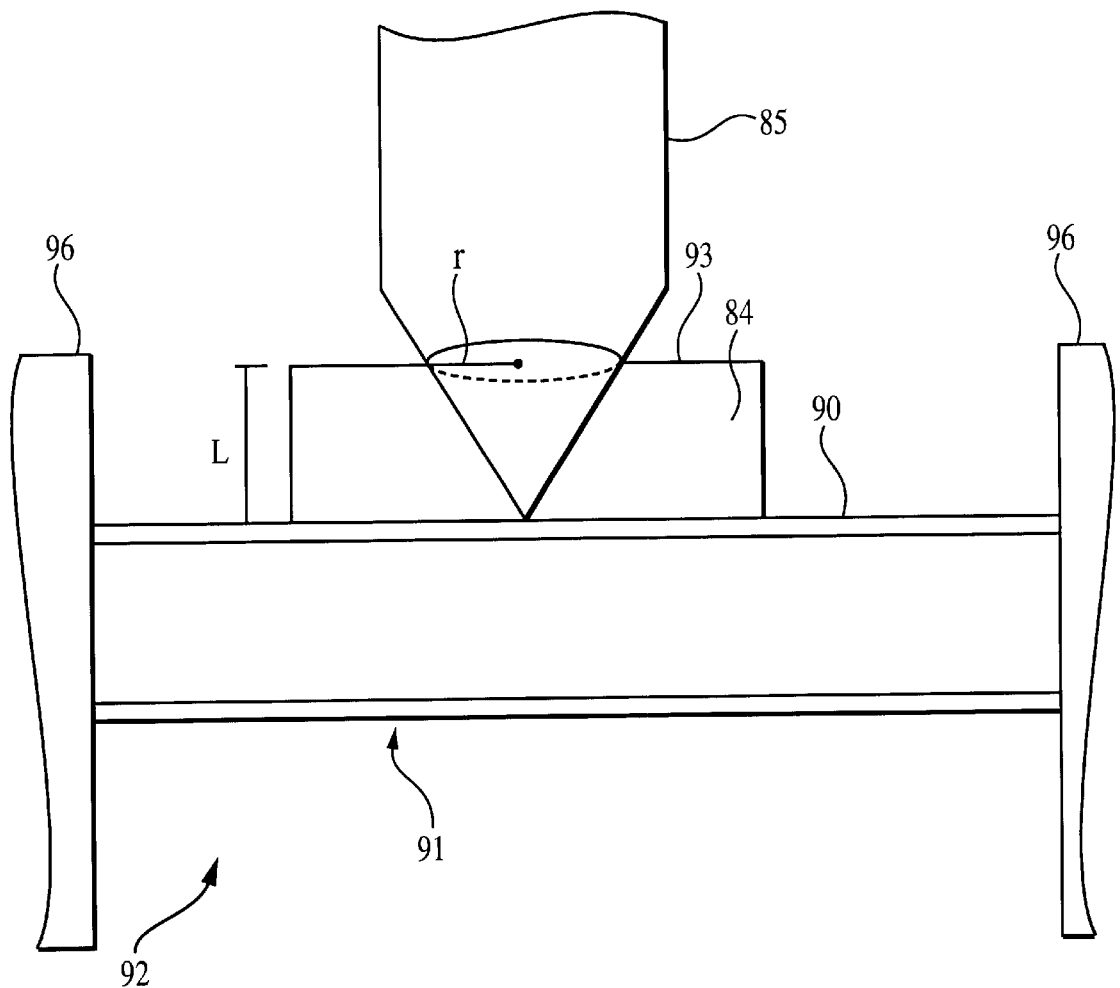
FIG. 24 illustrates a test probe penetrating a soft metallic surface.

FIG. 24 shows the same conical probe penetrating test contact 84 of the present invention. Since test contact 84 is a soft material such as Au or Ag, test probe 85 can penetrate the surface 93 of test contact 84. The advantage of the thicker test contact 84 is the increase of r and L. Thus, since test contact 84 is in ohmic contact with the Ni/Pd surface 90 of the lead fingers 91 of leadframe 92, there is a low resistance contact between test probe 85 and lead fingers 91 of leadframe 92. The figure illustrates the test probe 85 penetrating the entire test contact 84. The test probe 85 can also penetrate a shallower depth L as required by testing and burning-in.

Figure 25:
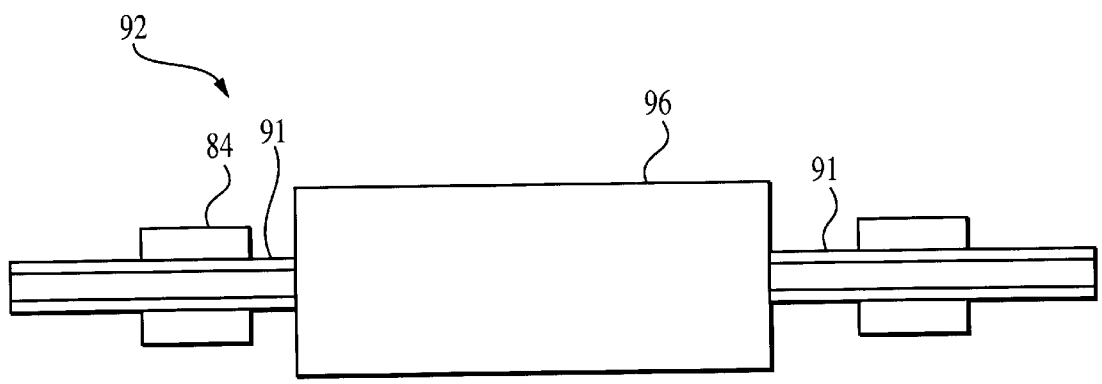
FIG. 25 illustrates an encapsulated leadframe with trimmed lead fingers
Figure 26:
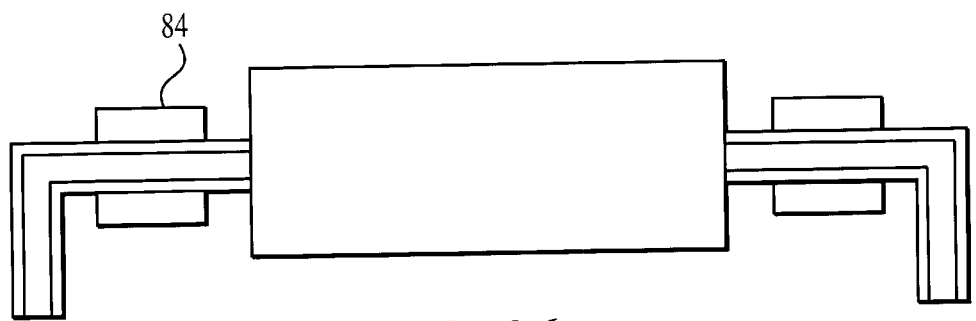
FIG. 26 illustrates an encapsulated leadframe with butt joint leads.
Figure 27:
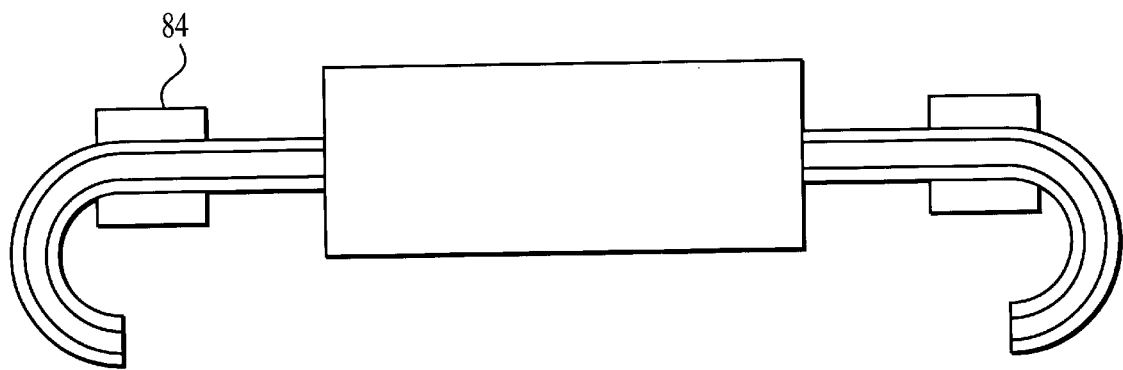
FIG. 27 illustrates an encapsulated leadframe with J-bend leads.
Figure 28:
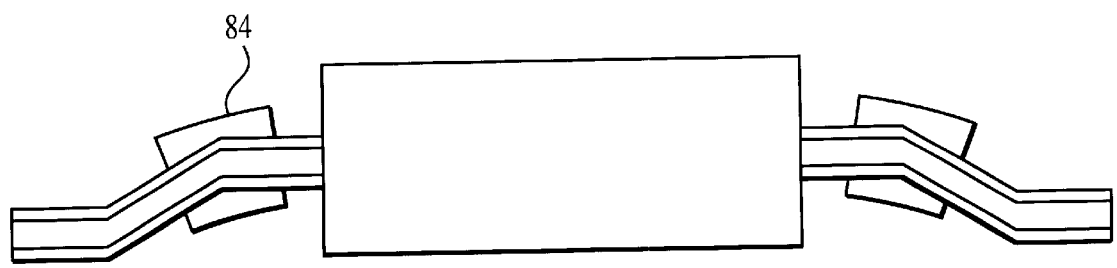
FIG. 28 illustrates an encapsulated leadframe with gull wing leads.

Referring now FIG. 25, lead frame 92 is trimmed such that molded carrier ring 95 (FIGS. 23, 24) is removed. The figure illustrates. any embodiment of the invention. The figure also illustrates that test contacts 84 are a part of the final semiconductor package. It is noted that as an embodiment of the invention the test contacts 84 can be removed by conventional semiconductor fabrication means. The contacts may be removed at any point during fabrication of the leadframe or during any step of the fabrication of the final semiconductor package. Care is to be taken so that test contacts 84 are limited to area that will not adversely affect soldering. Certain lead formations may require that test contacts 84 be limited to either the top or bottom surface of lead fingers 91. Various leads can be formed using a forming apparatus. FIG. 26 shows a butt joint configuration. FIG. 27 shows a J bend configuration. FIG. 28 illustrates a gull wing configuration. Embodiments of the invention are not limited to the types of leads illustrated in the figures. As stated above, the type of lead may determine the placement of test contact 84. For example, test contact 84 should not be soldered directly to a control board. The soft material used for test contact 84 may interfere with the intermetallic contact between the lead fingers and the control board.

While Ni/Pd has been:used as an example of a hard metallic layer, the invention is not limited to Ni/Pd coated leadframes. The invention can be used with any leadframes with any suitable material. It is also understood that the invention can be used with other semiconductor packaging schemes with leads that are tested and burned in.

While the preferred forms of the present invention have been described, it is to be understood that modifications will be apparent without departing from the spirit of the invention. Other implementations are within the scope of the following claims.

What is claimed is:

1. A semiconductor leadframe, comprising:
   at least one semiconductor chip mounting structure including:
      a semiconductor chip mounting pad for mounting a semiconductor chip thereon;
      fingers, having a top and bottom surface, said fingers connected to said semiconductor chip mounting pad;
      chip mounting pad supports for supporting said mounting pad, said chip mounting pad supports extending from the semiconductor leadframe to said chip mounting pad, thereby supporting said chip mounting pad;
      test contacts on at least one of said top and bottom surfaces of said fingers; and,
      first and second side rails formed on a pair of sides of said at least one semiconductor chip mounting structure, said side rails being substantially parallel and each said side rail including a plurality of indexing holes.

2. The semiconductor leadframe of claim 1 further comprising a semiconductor chip mounted on said chip mounting pad.

3. The semiconductor leadframe of claim 2, further comprising a semiconductor package encapsulating said semiconductor chip and said chip mounting pad.

4. The semiconductor leadframe of claim 1, wherein said test contacts comprise a soft metal.

5. The semiconductor leadframe of claim 1, wherein said test contacts comprise silver.

6. The semiconductor leadframe of claim 1, wherein said test contacts comprise gold.

7. The semiconductor leadframe of claim 1, wherein said test contacts are adapted for receiving a test probe.

8. A semiconductor leadframe, comprising:
   at least one semiconductor chip mounting structure including:
      fingers, having a top and bottom surface, said fingers connected to the semiconductor leadframe, wherein said fingers are adapted for receiving a semiconductor chip;
      test contacts on at least one of said top and bottom surfaces of said fingers; and,
      first and second side rails formed on a pair of sides of said at least one semiconductor chip mounting structure, said side rails being substantially parallel and each said side rail including a plurality of indexing holes.

9. The semiconductor leadframe of claim 8, further comprising a semiconductor chip mounted on said fingers.

10. The semiconductor leadframe of claim 9, further comprising a semiconductor package encapsulating said semiconductor chip.

11. A method of manufacturing a semiconductor device assembly, comprising the steps of:
   forming a semiconductor leadframe from an iron system alloy and including a pair of parallel side rails, each said side rail including at least one indexing hole, and a plurality of lead fingers;
   coating the leadframe with a hard, conductive material; and
   forming test contacts on said lead fingers.

12. The method of claim 11, wherein said step of coating the leadframe comprises coating the leadframe with palladium.

13. The method of claim 11, wherein said step of coating the leadframe comprises coating the leadframe with nickel.

14. The method of claim 11, wherein said step of forming test contacts comprises forming test contacts from a soft metal.

15. The method of claim 11, further comprising the step of mounting a semiconductor chip on said leadframe.

16. The method of claim 15, further comprising the step of encapsulating said leadframe, said semiconductor chip and a portion of said plurality of lead fingers in a semiconductor package.

17. The method of claim 16, further comprising the step of placing a test probe on said test contacts.

18. The method of claim 17, wherein said step of placing the test probe provides an interface to a testing apparatus.

19. The method of claim 17, wherein said step of placing said test probe provides a current to said test contacts to burn-in said semiconductor chip.

20. The method of claim 19, further comprising the step of removing said test contacts.

* * * * *

UNITED STATES PATENT AND TRADEMARK OFFICE
CERTIFICATE OF CORRECTION

PATENT NO. : 6,404,216 B1
DATED : June 11, 2002
INVENTOR(S) : Patrick W. Tandy

It is certified that error appears in the above-identified patent and that said Letters Patent is hereby corrected as shown below:

Column 2,
Line 50, change "the,leadframe" to -- the leadframe --;

Column 3,
Line 54, change "pad supports," to -- pad, --;

Column 4,
Line 6, change "invent,ion" to -- invention --;
Line 61, change "contact" to -- contacts --;

Column 5,
Line 20, change "by" to -- be --;
Line 21, change "connect,electrically" to -- connect electrically --;
Line 23, change "62." to -- 63. --;
Line 35, change "illustrate an" to -- illustrate both an --;

Column 6,
Line 42, change equation to $-- A = \pi(\overline{\sqrt{r^2+L^2}})r --$; and Column 7,
Line 11, change "to area" to -- to an area --.

Signed and Sealed this

Tenth Day of September, 2002

Attest:

JAMES E. ROGAN
Attesting Officer
Director of the United States Patent and Trademark Office